(12) United States Patent
Kim et al.

(10) Patent No.: US 11,312,883 B2
(45) Date of Patent: Apr. 26, 2022

(54) CONDUCTIVE PASTE COMPOSITION AND CERAMIC ELECTRONIC COMPONENT HAVING EXTERNAL ELECTRODES FORMED USING THE SAME

(71) Applicant: BESTGRAPHENE CO., LTD, Yeoju-si (KR)

(72) Inventors: Myeong Gi Kim, Yeoju-si (KR); Sung Min Hong, Yeoju-si (KR)

(73) Assignee: BESTGRAPHENE CO., LTD, Yeoju-si (KR)

( * ) Notice: Subject to any disclaimer, the term of this patent is extended or adjusted under 35 U.S.C. 154(b) by 0 days.

(21) Appl. No.: 16/813,745

(22) Filed: Mar. 10, 2020

(65) Prior Publication Data
US 2020/0308457 A1 Oct. 1, 2020

(30) Foreign Application Priority Data
Mar. 27, 2019 (KR) .......................... 10-2019-0034952

(51) Int. Cl.
| | | |
|---|---|---|
| *C09J 9/02* | (2006.01) | |
| *C08J 5/10* | (2006.01) | |
| *H01B 1/22* | (2006.01) | |
| *H05K 1/09* | (2006.01) | |
| *H01G 4/232* | (2006.01) | |
| *C08K 3/04* | (2006.01) | |
| *C08K 3/08* | (2006.01) | |

(Continued)

(52) U.S. Cl.
CPC . *C09J 9/02* (2013.01); *C08J 5/10* (2013.01); *C08K 3/042* (2017.05); *C08K 3/08* (2013.01); *C08K 7/02* (2013.01); *C08K 9/02* (2013.01); *H01B 1/22* (2013.01); *H01B 1/24* (2013.01); *H01G 4/2325* (2013.01); *H05K 1/095* (2013.01)

(58) Field of Classification Search
None
See application file for complete search history.

(56) References Cited

U.S. PATENT DOCUMENTS

| | | | | |
|---|---|---|---|---|
| 6,533,963 | B1 * | 3/2003 | Schleifstein | ............. C08K 9/02 252/511 |
| 2005/0178496 | A1 * | 8/2005 | Aisenbrey | ........ G06K 19/07749 156/244.11 |

(Continued)

FOREIGN PATENT DOCUMENTS

| | | | |
|---|---|---|---|
| CN | 105484016 A | * | 4/2016 |
| JP | 2018-170273 A | | 11/2018 |

(Continued)

OTHER PUBLICATIONS

English machine transation of Liu (CN 105484016 A), accessed online from Espacenet; pp. 1-14. The publication date of the Chinese patent is Apr. 13, 2016. (Year: 2016).*

(Continued)

*Primary Examiner* — Katie L. Hammer
(74) *Attorney, Agent, or Firm* — Revolution IP, PLLC (57) ABSTRACT

The present invention relates to a conductive paste composition for manufacturing a conductive film formed by dispersing conductive particles in a polymer resin, the conductive paste composition including: conductive metal particles, a polymer fiber, a polymer resin, and an auxiliary additive, wherein the polymer fiber is coated with a first graphene on a surface thereof.

6 Claims, 6 Drawing Sheets

(51) Int. Cl.
  *C08K 7/02*   (2006.01)
  *C08K 9/02*   (2006.01)
  *H01B 1/24*   (2006.01)

(56) References Cited

U.S. PATENT DOCUMENTS

2006/0098387 A1* 5/2006 Chandra ................ F16J 15/064
                                                    361/303
2018/0155520 A1* 6/2018 Nazarpour ............... C09D 7/80

FOREIGN PATENT DOCUMENTS

KR    10-2014-0012333 A    2/2014
KR        10-1891141 B1    8/2018
WO    WO-2018076098 A1 *   5/2018  ............. H01G 11/24

OTHER PUBLICATIONS

Neves, A.I.S., Rodrigues, D.P., De Sanctis, A. et al. "Towards conductive textiles: coating polymeric fibres with graphene." Scientific Reports 7, 4250 (2017). https://doi.org/10.1038/s41598-017-04453-7 (Year: 2017).*

* cited by examiner

CONDUCTIVE PASTE COMPOSITION AND CERAMIC ELECTRONIC COMPONENT HAVING EXTERNAL ELECTRODES FORMED USING THE SAME

CROSS-REFERENCE TO RELATED APPLICATION

This application claims priority to and the benefit of Korean Patent Application No. 10-2019-0034952 filed in the Korean Intellectual Property Office on Mar. 27, 2019, the entire contents of which are incorporated herein by reference.

BACKGROUND

Technical Field

The present invention relates to an electrically conductive paste composition and an electronic component having an external electrode formed using the same.

Background Art

In order to form an electrode of an electronic component, a circuit of a printed circuit board, an electromagnetic shielding film, an electromagnetic shielding material, or the like, a conductive paste composition where a conductive metal filler is dispersed in a polymer resin is widely used.

Such a conductive paste composition requires roughly two performances. Those are high conductivity and good mechanical properties. However, in the technical field of the conductive paste composition, the conductivity and mechanical properties are in a trade-off relationship with each other.

That is, in order to increase the conductivity, if a content of a metal filler such as silver powder or copper powder of the conductive paste composition is increased, there is a problem that the mechanical properties such as tensile strength are sharply inferior.

In order to increase physical properties such as the tensile strength, the way such as adding fiber is used, but since general fiber is an insulating material, the conductivity is decreased in proportion to an amount of the added fiber.

In order to solve such a problem, a method of using a carbon fiber having excellent electrical and mechanical performances or using silver (Ag) or silver (Ag) coated copper (Cu) powder having high conductivity as the metal filler has been proposed.

However, the carbon fiber and silver (Ag) are expensive and are not practically used in the electronic component.

Thus, in the conductive paste composition, there is a need for a new method of increasing both the conductivity and the mechanical properties in a trade-off relationship without a significant increase in cost.

SUMMARY

Technical Problem

The present invention has been made to solve the above problems, and an object of the present invention is to provide a new conductive paste composition capable of improving conductivity of a conductive film manufactured of a conductive paste composition, and at the same time improving mechanical performance such as tensile strength.

On the other hand, other objects that are not specified in the present invention will be further considered within the scope that can be easily inferred from the following detailed description and effects thereof.

Solution to Problem

In order to achieve the object described above, according to an aspect, there is provided a conductive paste composition including: conductive metal particles, a polymer fiber, a polymer resin, and an auxiliary additive, in which the polymer fiber is coated with a first graphene on a surface thereof.

In an example, a content of the polymer fiber may be 0.1 to 1 wt %.

In an example, the polymer fiber may have a thickness of 1 to 10 μm and a length of 0.01 to 10 mm.

In an example, the first graphene coated on the polymer fiber may have a thickness of 0.2 to 10 nm.

In an example, the polymer fiber may be any one or a combination thereof selected from a group consisting of polyethylene terephthalate (PET) fiber, polyethylene (PE) fiber, polyurethanes (PU) fiber, polyamide (PA) fiber, polycarbonate (PC) fiber, polyoxymethylene (POM) fiber, polybutyrene terephthalate (PBT) fiber, acrylonitrile butadiene styrene (ABS) fiber, and polypropylene (PP) fiber.

In an example, a graphene additive may be further included, and the graphene additive may be any one or a combination thereof selected from a group consisting of graphene flake, reduced graphene, graphene oxide, and modified graphene.

In an example, a content of the graphene additive may be 0.1 to 5 wt %.

In an example, the conductive metal particles may be coated with a second graphene on a surface thereof.

In an example, a content of the conductive metal particles may be 65 to 92 wt %, a content of the polymer resin may be 7 to 22 wt %, and a balance may include auxiliary additives.

In order to achieve the object described above, according to another aspect, there is provided a ceramic electronic component including: a ceramic body; and an external electrode disposed outside the ceramic body. In this case, the external electrode is formed by curing the conductive paste composition according to any one of the examples.

Advantageous Effects of Invention

The conductive paste composition according to an example of the present invention includes the graphene coated polymer fiber of 0.1 to 1 wt %, and thereby the conductivity and tensile strength in a trade-off relationship with each other can be increased together.

In addition, in the ceramic electronic component according to another example of the present invention, the external electrode is formed of the conductive paste composition of an example, and such a ceramic electronic component is mounted on a printed circuit board (PCB) and then a 10 mm flexural strength evaluation is performed. A result thereof is very good in which a crack occurrence rate of the ceramic body is substantially 3%.

On the other hand, even if effects are not explicitly mentioned herein, the effects described in the following specification expected by the technical features of the present invention and its tentative effects are to be treated as described in the specification of the present invention.

The accompanying drawings reveal that they are illustrated as a reference for understanding of the technical idea of the present invention, by which the scope of the present invention is not limited.

DETAILED DESCRIPTION

In the following description of the present invention, in a case in which it is determined that the subject matter of the present invention may be unnecessarily obscured by those skilled in the art with respect to related known functions, detailed description thereof will be omitted.

Figure 1:
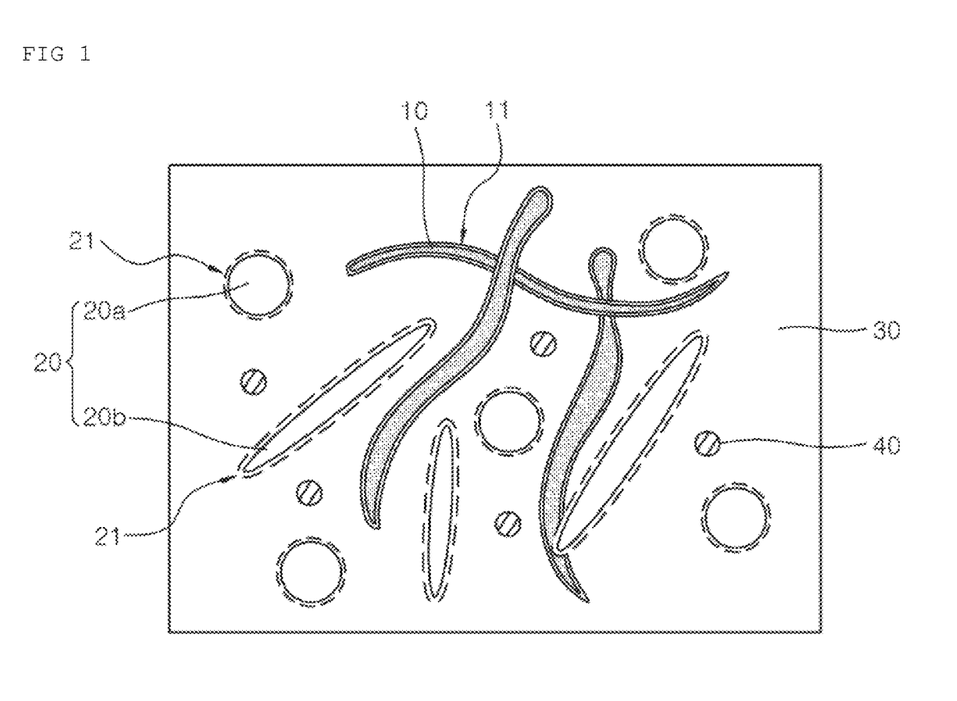
FIG. 1 is a schematic view of a conductive paste composition according to an example of the present invention.

FIG. 1 is a schematic view of a conductive paste composition according to an example of the present invention.

Referring to FIG. 1, the conductive paste composition according to an example of the present invention includes a polymer fiber 10, conductive metal particles 20, and a polymer resin 30. In this case, in addition to the polymer resin 30, an auxiliary additive is further included. The auxiliary additive means a solvent, a surfactant, a coupling agent, or the like.

The polymer fiber 10 uses any one or a combination thereof selected from a group consisting of polyethylene terephthalate (PET) fiber, polyethylene (PE) fiber, polyurethanes (PU) fiber, polyamide (PA) fiber, polycarbonate (PC) fiber, polyoxymethylene (POM) fiber, polybutyrene terephthalate (PBT) fiber, acrylonitrile butadiene styrene (ABS) fiber, and polypropylene (PP) fiber. The polymer fiber 10 has a thickness of 1 to 10 μm and a length of 0.01 to 10 mm.

In particular, a first graphene 11 is coated on a surface of the polymer fiber 10 of the conductive paste according to an example of the present invention. Graphene ink is manufactured by using any one or a combination thereof selected from a group consisting of graphene flake, reduced graphene, graphene oxide, and modified graphene, and then the first graphene 11 is coated on the surface of the polymer fiber 10 by using a sol-gel method, or the like. In this case, a thickness of the first graphene 11 may be 0.2 to 10 nm. To this end, a content of the first graphene 11 may be 0.1 to 1% of the polymer fiber based on the mass.

Figure 2:
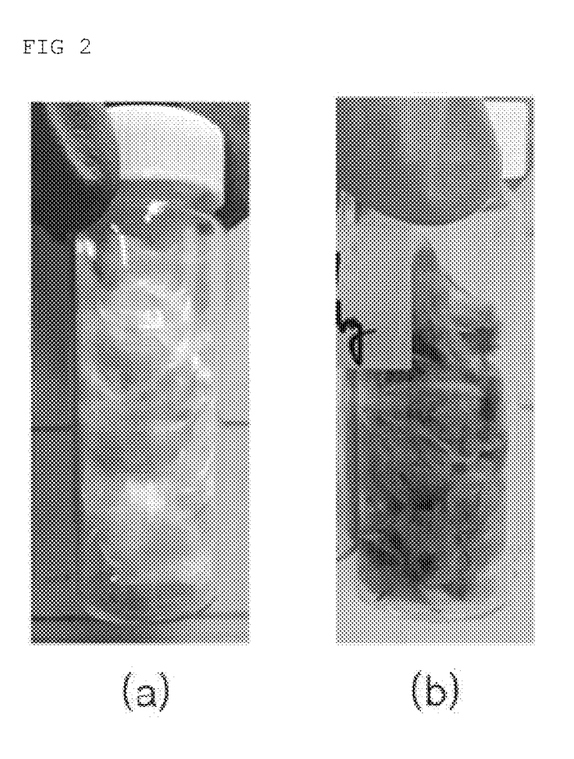
FIG. 2 is a photograph illustrating a non-graphene coated polymer fiber and a graphene coated polymer fiber, respectively.

FIG. 2 is a photograph illustrating a polymer fiber (FIG. 2($a$)) on which the first graphene is not coated, and a polymer fiber (FIG. 2($b$)) on which the first graphene is coated, respectively. Here, PET fiber is used as the polymer fiber.

The polymer fiber plays a role of improving the tensile strength of the conductive film when being added to the conductive paste composition. However, there is a problem that the conductivity of the conductive film is decreased in proportion to an added amount due to non-conductivity thereof.

However, the conductive paste composition according to an example of the present invention improves conductivity and at the same time improves mechanical performance such as tensile strength by coating the first graphene 11 on the surface of the polymer fiber 10.

In this case, the content of the polymer fiber 10 coated with the first graphene 11 may be 0.1 to 1 wt % based on the total composition. In a case in which the content of the polymer fiber 10 on which the first graphene 11 is coated is less than 0.1 wt %, it does not contribute to the increase in tensile strength of the conductive film at all, and in a case in which the content of the polymer fiber 10 on which the first graphene 11 exceeds 1 wt %, there is a problem in that the sheet resistance of the conductive film increases due to an increase in the viscosity of the paste and a decrease in the filling of a material. Effects according to the polymer fiber 10 on which the first graphene 11 is coated will be described later through the specific examples.

The conductive metal particles 20 include spherical first conductive metal particles 20$a$ and flake type second conductive metal particles 20$b$. In this case, a diameter of the first conductive metal particles 20$a$ is 0.1 to 5 μm, and a length of a long axis of the second conductive metal particles 20$b$ is 1 to 10 μm.

As the conductive metal particles 20, at least one or an alloy of copper (Cu), silver (Ag), lead (Pb), platinum (Pt), and nickel (Ni) may be used. In addition, such as particles coated with silver on copper as the conductive metal particles 20, particles, which are obtained by placing a relatively inexpensive metal among highly conductive metals is placed at a center thereof, and a relatively expensive metal having excellent conductivity is coated on an outside thereof, can be used. The content of the conductive metal particles 20 is 65 to 92 wt % based on the total composition.

The conductive paste composition according to an example of the present invention may not be made of only the metal described above, but the second graphene 21 can be coated on the surface of the conductive metal particles 20. If the conductive metal particles 20 are copper, the second graphene 21 is coated on the surface of the copper particles, and if the conductive metal particles 20 are particles obtained by coating the surface of copper with silver, the second graphene 21 is coated again on the surface of the silver coating layer. As described above, in a case in which the second graphene 21 is coated on the surface of the conductive metal particles 20, a bonding force between the metal and the polymer resin can be improved, thereby improving the mechanical performance of the conductive film manufactured of the conductive paste composition.

Further, the second graphene 21 coated on the conductive metal particles 20 has an advantage of improving electrical connectivity, thereby improving conductivity of the conductive film. Graphene ink is manufactured by using any one or a combination thereof selected from a group consisting of graphene flake, reduced graphene, graphene oxide, and modified graphene, and then the second graphene 21 is coated on the surface of the polymer fiber 10 by using a sol-gel method, or the like. In this case, a thickness of the second graphene 21 may be 0.2 to 10 nm.

In addition, the content of the second graphene 21 may be 0.1 to 0.3% of the conductive metal particles based on the mass.

As the polymer resin 30, polyvinyl butyral, polyvinyl alcohol, acryl-based resin, epoxy-based resin, phenol-based resin, alkyd-based resin, cellulose-based polymer, rosin-based resin, or the like can be used. In particular, the epoxy-based resin may be any one selected from liquid or solid epoxy resin which is generally used. Examples thereof include phenolic diglycidyl ether of bisphenol-A or bisphenol-F, aromatic glycidyl ether such as phenol-, or cresol-novolac, glycidyl amine such as tetraglycidyl methylene dianiline, cycloaliphatic epoxy resin, and the like. On the other hand, the epoxy resin can be used alone or in combination of two types or more, and can be used in combination with other thermoplastic resins. The content of the polymer resin 30 may be 7 to 22 wt % based on the total composition. In a case in which the content of the polymer resin 30 is less than 7 wt %, the bonding strength between the conductive materials is weak, the tensile strength is significantly decreased, or cracks occur. Therefore, there is a problem in the mechanical performance. In a case in which the content of the polymer resin 30 exceeds 22 wt %, there is a problem that the conductivity is decreased.

In addition to the polymer resin 30, an auxiliary additive may be further included, the auxiliary additive may further include a hardener a catalyst, a surfactant, a coupling agent, a solvent, and the like.

The solvent serves to improve the flowability or processability of the conductive paste composition. The solvent is not particularly limited as long as components such as the conductive metal particles 20 and the polymer fiber 10 can be easily dissolved or dispersed. For example, the solvent may include an alcohol-based solvent such as terpineol, a terpene-based solvent such as isobornyl acetate, a glycol-based solvent such as ethylene glycol, a glycolether-based solvent such as diethylene glycol monobutyl ether (butyl carbitol), an ester-based solvent, a hydrocarbon-based solvent such as toluene, xylene, and other solvents having a high boiling point such as mineral spirit. Alternatively, the solvent may include propylene glycol monomethyl ether acetate (PGMEA), diethylene glycol monoethyl ether acetate (DGMEA), dihydroterpineol (DHT), dihydroterpinylacetate (DHTA), N-Methyl-2-pyrrolidone (NMP), dimethylformamide (DMF), and methyl ethyl ketone (MEK). The content of the solvent may be 5 to 30 wt % of the total composition. In a case in which the content of the solvent is less than 5 wt %, there is a problem that the preparation is decreased, and in a case in which the content of the solvent exceeds 30 wt %, the solvent scatters during heating, causing voids. If voids occur, there is a problem that the thermal conductivity of the conductive film is decreased and the resistance is increased.

The curing agent serves to connect functional groups of the polymer resin with each other. In the case of epoxy resin, there are many types of curing agents for thermosetting, and a variety of epoxy-curing agents may be combined depending on a purpose. A curing time can be controlled from a few seconds to a few days, and there is a latent curing agent that does not occur for a long time at room temperature. The curing agent can be classified into a room temperature curing type, a temperature-up curing type, and a high temperature curing type. In a case of one-liquid type paste for a printing process during manufacturing of the electronic component, since the curing agent has to be stable at room temperature, the high temperature curing type may be used. A curing start temperature of the curing agent or curing accelerator may be in a range of 100 to 200° C. Specifically, the curing agent may be an amine-based curing agent, a dicyanodiamines (DICY) curing agent, an imidazole curing agent, a latent curing agent, a phenol novolac curing agent, an acid anhydride curing agent, or the like. However, in the case of some of amine-based curing agent, a complex compound may be formed by being reacted with copper, which is conductive metal particles, and thus the stability of the paste may be decreased. Therefore, preferably, the phenol novolak curing agent or the acid anhydride curing agent may be used. In addition, it is preferable to further use a curing accelerator in the curing agent in order to improve properties of a cured body, and it is preferable to mainly use an imidazole and an imidazole modified bodies. Although the imidazole is an amine-based compound capable of forming the complex compound with copper, it is possible to impart insolubility to epoxy resin at room temperature, and thus the imidazole has low reactivity with copper, and with only a small amount of use, anionic homopolymerization of the epoxy resin can be initiated. It is also because it has a wide variety of modified bodies, it is possible to modify the properties of the cured body in various ways. The content of the curing agent may be 5 to 10 wt % with respect to the total composition.

As the catalyst, a phosphine-based, boron-based, or imidazole-based catalyst may be used as an additive to control the curing rate. As the phosphine-based curing catalyst, there are Triphenylphosphine, Tri-o-tolylphosphine, Tri-m-tolylphosphine, Tri-p-tolylphosphine, Tri-2,4-xylylphosphine, Tri-2,5-xylylphosphine, Tri-3,5-xylylphosphine, Tribenzylphosphine, Tris(p-methoxyphenyl)phosphine, Tris(p-tert-butoxyphenyl)phosphine, Diphenylcyclohexylphosphine, Tricyclohexylphosphine, Tributylphosphine, Tri-tert-butylphosphine, Tri-n-octylphosphine, Diphenylphosphinostyrene, Diphenylphosphinostyrene, Tri-n-octylphosphine oxide, Diphenylphosphinyl hydroquinone, Tetrabutylphosphonium hydroxide, Tetrabutylphosphonium acetate, Benzyltriphenylphosphonium hexafluoroantimonate, Tetraphenylphosphonium tetraphenylborate, Tetraphenylphosphonium tetra-p-tolylborate, Benzyltriphenylphosphonium tetraphenylborate, Tetraphenylphosphonium tetrafluoroborate, p-Tolyltriphenylphosphonium tetra-p-tolylborate, Triphenylphosphine triphenylborane, 1,2-Bis(diphenylphosphino)ethane, 1,3-Bis(diphenylphosphino)propane, 1,4-Bis(diphenylphosphino)butane, 1,5-Bis(diphenylphosphino)pentane, and the like. As the boron-based curing catalyst, one or more of Phenyl boronic acid, 4-Methylphenyl boronic acid, 4-Methoxyphenyl boronic acid, 4-Trifluoromethoxyphenyl boronic acid, 4-tert-Butoxyphenyl boronic acid, 3-Fluoro-4-methoxyphenyl boronic acid, Pyridine-triphenylborane, 2-Ethyl-4-methyl imidazolium tetraphenylborate, and 1,8-Diazabicyclo[5.4.0], undecene-7-tetraphenylborate can be used. As the imidazole-based curing catalyst, there are 2-methylimidazole, 2-undecylimidazole, 2-heptadecylimidazole, 2-ethyl-4-methylimidazole, 2-phenylimidazole, 2-phenyl-4-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium-trimellitate, 1-cyanoethyl-2-phenylimidazolium-trimellitate, 2,4-diamino-6-[2'-methylimidazoly-(1')]-ethyl-s-triazine, 2,4-diamino-6-[2'-undecylimidazoly-(1')]-ethyl-s-triazine, 2,4-diamino-6-[2'-ethyl-4'methylimidazoly-(1')]-ethyl-striazine, 2,4-diamino-6-[2'-methylimidazoly-(1')]-ethyl-s-triazine isocyanuric acid adduct dihydrate, 2-phenylimidazole isocyanuric acid adduct, 2-methylimidazole isocyanuric acid adduct dihydrate, 2-phenyl-4,5-dihydroxymethylimidazole, 2-phenyl-4-methyl-5-hydroxymethylimidazole, 2,3-dihyro-1H-pyrrolo[1,2-a]benzimidazole, 4,4'-methylene bis(2-ethyl-5-methylimidazole), 2-methylimidazoline, 2-phenylimidazoline, 2,4-diamino-6-vinyl-1,3,5-triazine, 2,4-diamino-6-vinyl-1,3,5-triazine isocyanuric acid adduct, 2,4-diamino-6-methacryloyloxylethyl-1,3,5-triazine isocyanuric acid adduct, 1-(2-cyanoethyl)-2-ethyl-4-methylimidazole, 1-cyanoethyl-2-methylimidazole, 1-(2-cyanoethyl)2-phenyl-4,5-di-(cyanoethoxymethyl)imidazole, 1-acetyl-2-phenylhydrazine, 2-ethyl-4-methyl imidazoline, 2-benzyl-4-methyl dimidazoline, 2-ethyl imidazoline, 2-pheny imidazole, 2-phenyl-4,5-dihydroxymethylimidazole, and the like. In this case, the catalyst may be used alone or in combination of two types or more. The content of the catalyst may be 1 wt % or less based on the total composition.

The coupling agent serves to improve the bonding force between the organic and inorganic materials and, in the present invention, a silane coupling agent can be used.

As the silane coupling agent, 3-glycidoxypropyltrimethoxysilnae (GPTMS), 3-glycidoxypropyltriethoxysilnae (GPTES), Vinyltriethoxsilane, Aminopropyltrimethoxysilane (PTMS), and the like may be mainly used, but is not particularly limited thereto. The silane coupling agent may be used alone or in combination of two types or more thereof. The content of coupling agent may be 1 wt % or less based on the total composition.

The surfactant serves to improve dispersion stability. In the present invention, as the surfactant, formic acid, acetic acid, propionic acid, butanoic acid, hexanoic acid, heptanoic acid, octanoic acid, nonanoic acid, decanoic acid, undecanoic acid, lauric acid, myristic acid, palmitic acid, stearic acid, oleic acid, linoleic acid, linolenic acid, phosphorous acid, or the like may be mainly used, but is not particularly limited thereto. The Surfactant may be used alone or in combination of two types or more thereof. The content of surfactant is 0.1 to 1 wt % based on the total composition.

On the other hand, the conductive paste composition according to an example of the present invention may further include a graphene additive 40. The graphene additive improves the electrical properties of polymer resins and the connectivity between conductive materials. Accordingly, electrical and thermal (heat dissipation) paths of the conductive film are activated. That is, the graphene additive 40 greatly improves the electrical conductivity of the conductive film, thereby being useful to realize low resistance properties of the conductive film. As the graphene additive 40, any one or a combination thereof selected from a group consisting of any one selected from the group consisting of graphene flake, reduced graphene, graphene oxide, and modified graphene may be used. In this case, the content of the graphene additive 40 may be 0.1 to 5 wt % based on the total composition, and preferably 1 to 4 wt %.

The effect of the graphene additive 40 as described above will be described again through specific examples later.

By forming a conductive film using the conductive paste composition according to an example of the present invention described above, the effects of the type and content of each component of the conductive paste composition according to an example of the present invention is examined.

A process of forming the conductive film is as follows.

First, a step of preparing a polymer fiber on which a first graphene is coated and a step of preparing a conductive metal are performed. In addition, a step preparing a graphene additive may be further performed. In this case, the conductive metal particles, the graphene additive, and the graphene coated polymer fiber can be collectively referred to as the conductive particles.

On the other hand, in the present specification, the first graphene, the second graphene, and the graphene additive can be prepared by using a method disclosed in the Korean Patent Application No. 2017-0088502, which was determined to be a patent on Mar. 25, 2019 to Uduck Advanced Materials Co., Ltd. but are not limited thereto.

Commercially available polymer fiber can be purchased and used. In order to coat the first graphene on the polymer fiber, a first graphene ink composition including the first graphene is manufactured. The first graphene is coated on the polymer fiber by using the first graphene ink composition with a sol-gel method.

In the step of preparing of the conductive metal particles, a step of coating expensive conductive metal particles having excellent conductivity on the surface of the inexpensive conductive metal particles or the coating second graphene on the surface of the conductive metal particles may be further performed. Coating the second graphene on the conductive metal particles may be performed by preparing a second graphene ink composition and using the sol-gel method as in the first graphene.

Then, the first graphene coated polymer fiber and the conductive metal particles are put in the polymer resin and pre-dispersed by using a mixer. In case of adding the graphene additive, the graphene additive is dispersed together. After the pre-dispersion, a paste main dispersion is performed by adding the auxiliary additive and using a three-roll mill or the like.

The completed conductive paste is subjected to a stabilization process, and then being coated and cured to form a conductive film.

By evaluating the performance of the conductive film formed as described above, the effects of the type and the content of each component of the conductive paste composition according to an example of the present invention were examined.

Figure 3:
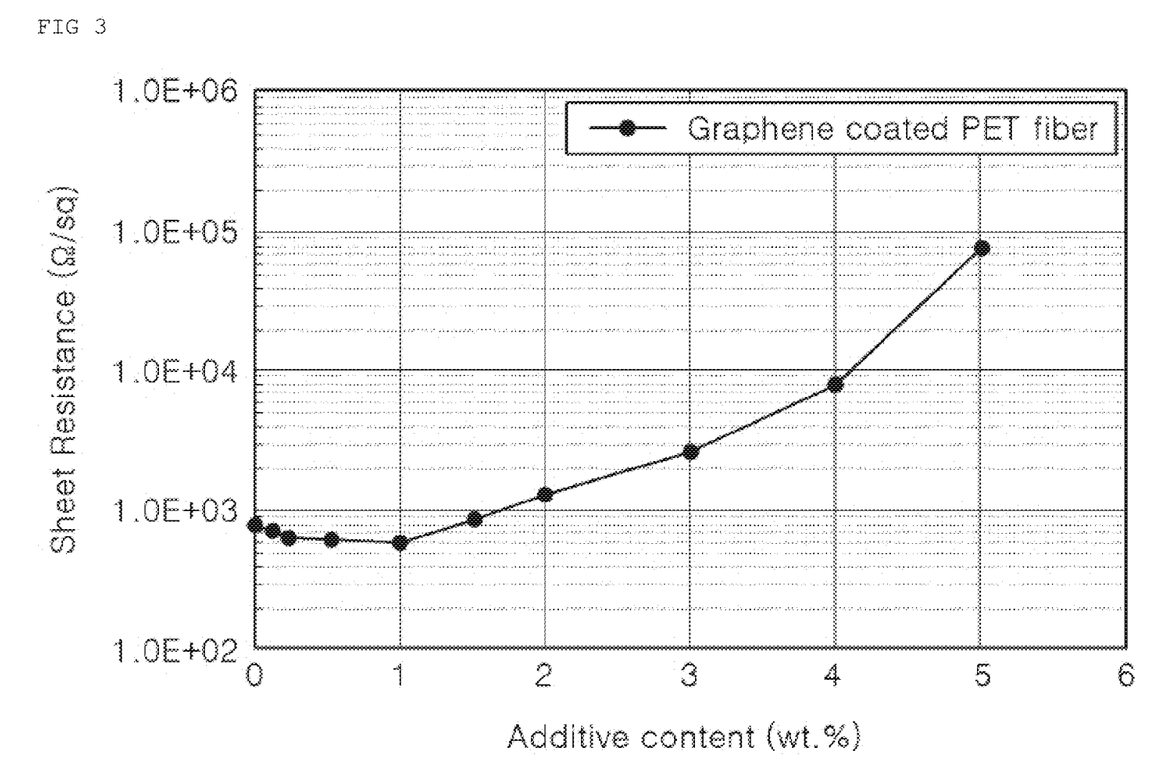
FIG. 3 is graph illustrating a result of measuring a change in tensile strength according to a content of a graphene coated polymer of a conductive film manufactured of the conductive paste composition according to an example of the present invention.
Figure 4:
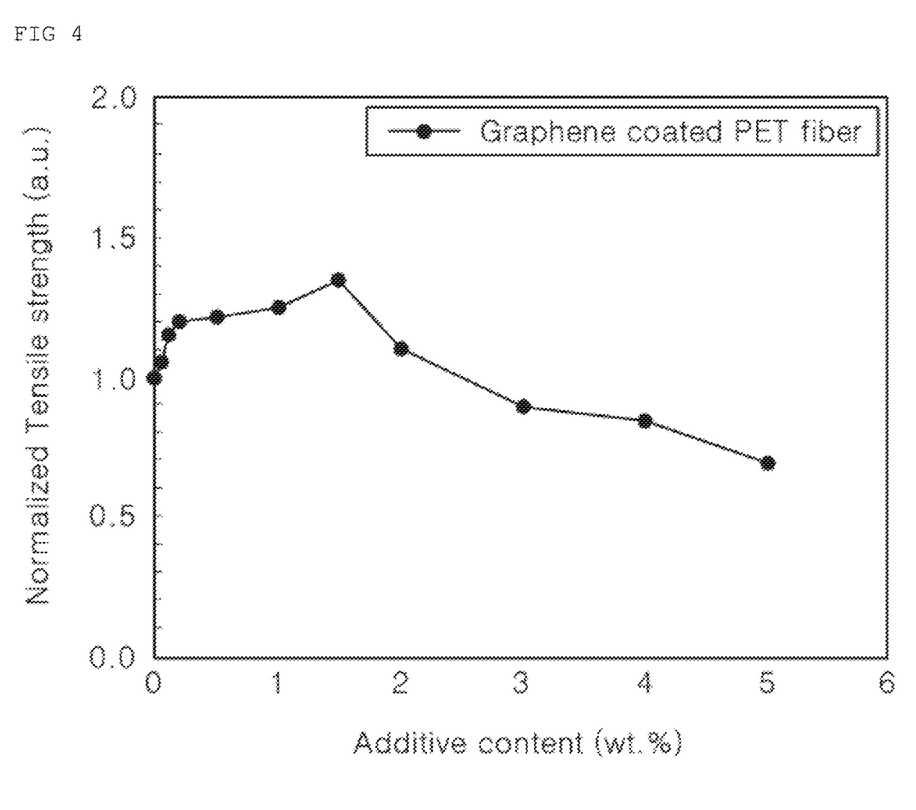
FIG. 4 is a graph illustrating a result of measuring a change in sheet resistance according to the content of the graphene coated polymer of the conductive film manufactured of the conductive paste composition according to an example of the present invention.

FIG. 3 illustrates a result of measuring the change in the tensile strength according to the content of the graphene coated polymer of the conductive film manufactured of the conductive paste composition according to an example of the present invention, and FIG. 4 illustrates a result of measuring the change in sheet resistance according to the content of the graphene coated polymer of the conductive film manufactured of the conductive paste composition according to an example of the present invention.

The conductive paste composition, which is used in FIGS. 3 and 4, used the following composition. The PET fiber (average thickness: 10 μm and average length: 5 mm) was used as the polymer fiber, and the PET fiber, on which the first graphene of 0.5 wt % based on the weight of the polymer fiber was coated, was used. As the conductive metal particles, second graphene coated copper particles were used, and the second graphene was 0.2 wt % based on the weight of the copper particles. The graphene additive was 1 wt % based on the total composition. In this case, the changes in the sheet resistance and the tensile strength according to the content of the polymer fiber were measured while increasing the content of the polymer fiber.

Referring to FIG. 3, it can be seen that the tensile strength of the conductive film is greatly improved as the content of the polymer fiber coated with the first graphene increases. In particular, in a case in which the content of the polymer fiber coated with the first graphene is 0.1 to 1.5 wt %, the tensile strength of the conductive film continuously increases. However, in a case in which the content of the polymer fiber exceeds 1.5 wt %, the tensile strength decreases sharply. This is because, as the content of the polymer fiber increases, the viscosity of the conductive paste increases, so that the filling rate decreases and the curing density of the resin decreases.

Referring to FIG. 4, it can be seen that the sheet resistance of the conductive film decreases as the content of the polymer fiber coated with the first graphene increases. In particular, in a case in which the content of the polymer fiber coated with the first graphene is 0.1 to 1.0 wt %, the sheet resistance of the conductive film is continuously decreased. However, in a case in which the content of the polymer fiber exceeds 1.0 wt %, the sheet resistance starts to increase, and from 1.5 wt %, the sheet resistance is higher than that in a case in which the polymer fiber coated with the first graphene is not added. As described above, as the content of the polymer fiber increases, the viscosity of the conductive paste increases and the filling rate decreases, thereby greatly increasing the sheet resistance.

Summarizing the results of FIGS. 3 and 4, the conductive paste composition according to an example of the present invention includes the first graphene coated polymer fiber of 0.1 to 1.5 wt %, thereby improving the tensile tension while maintaining the sheet resistance. Preferably, the first graphene coated polymer fiber is 0.1 to 1.0 wt % thereby decreasing the sheet resistance and improving the tensile strength.

Figure 5:
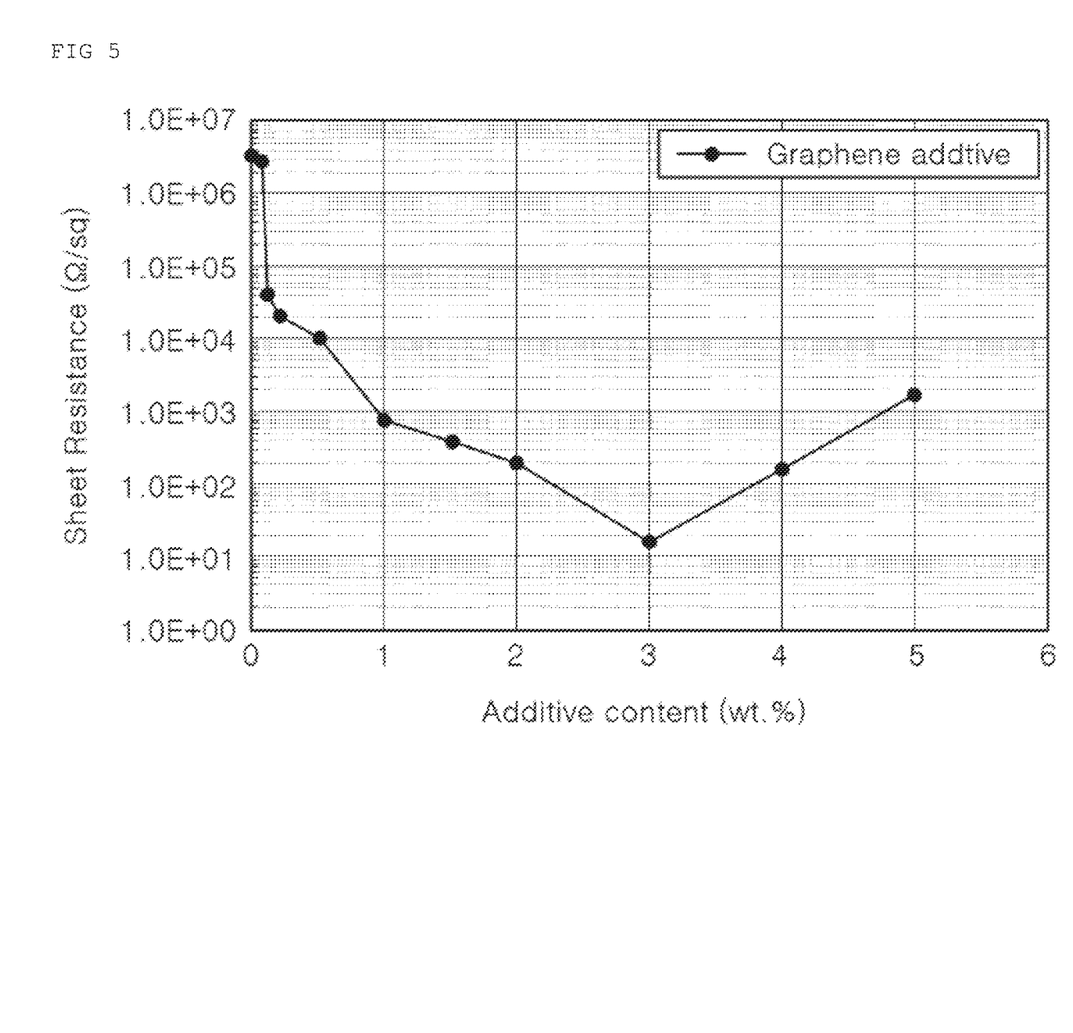
FIG. 5 is a graph illustrating a result of measuring a change in sheet resistance according to a graphene additive of a conductive film manufactured of a conductive paste composition according to an example of the present invention.

FIG. 5 illustrates a result of measuring the change in the sheet resistance according to the graphene additive of the conductive film manufactured of the conductive paste composition according to an example of the present invention.

The conductive paste composition, which was used in FIG. 5, used the following composition. To see the effect of the graphene additives more clearly, the polymer fiber was not included. As the conductive metal particles, the second graphene coated copper particles were used, and the second graphene was 0.2 wt % based on the weight of the copper particles. The graphene flake was used as the graphene additive. In this case, the change in the sheet resistance according to the graphene content was measured while increasing the content of the graphene additive.

Referring to FIG. 5, it can be seen that the sheet resistance is decreased as the graphene additive is added. In particular, in a case in which the content of the graphene additive is 0.1 wt % or more, the sheet resistance of the conductive film is decreased by 10 times or more. Even in a case in which the content of the graphene additive is 5 wt %, it can be seen that the sheet resistance of the conductive film was very low compared to a case in which the graphene additive was not added. However, when the content of the graphene additive is 3 wt % or more, the sheet resistance of the conductive film starts to increase again, because of the increase in the viscosity of the conductive paste due to the excessive graphene additive. Taken together, the content of the graphene additive may be 0.1 to 5 wt %. Preferably, in a case in which the content of the graphene additive is 1 to 4 wt %, the sheet resistance of the conductive film may be decreased by 1,000 times or more compared with a case in which the graphene additive is not included.

Figure 6:
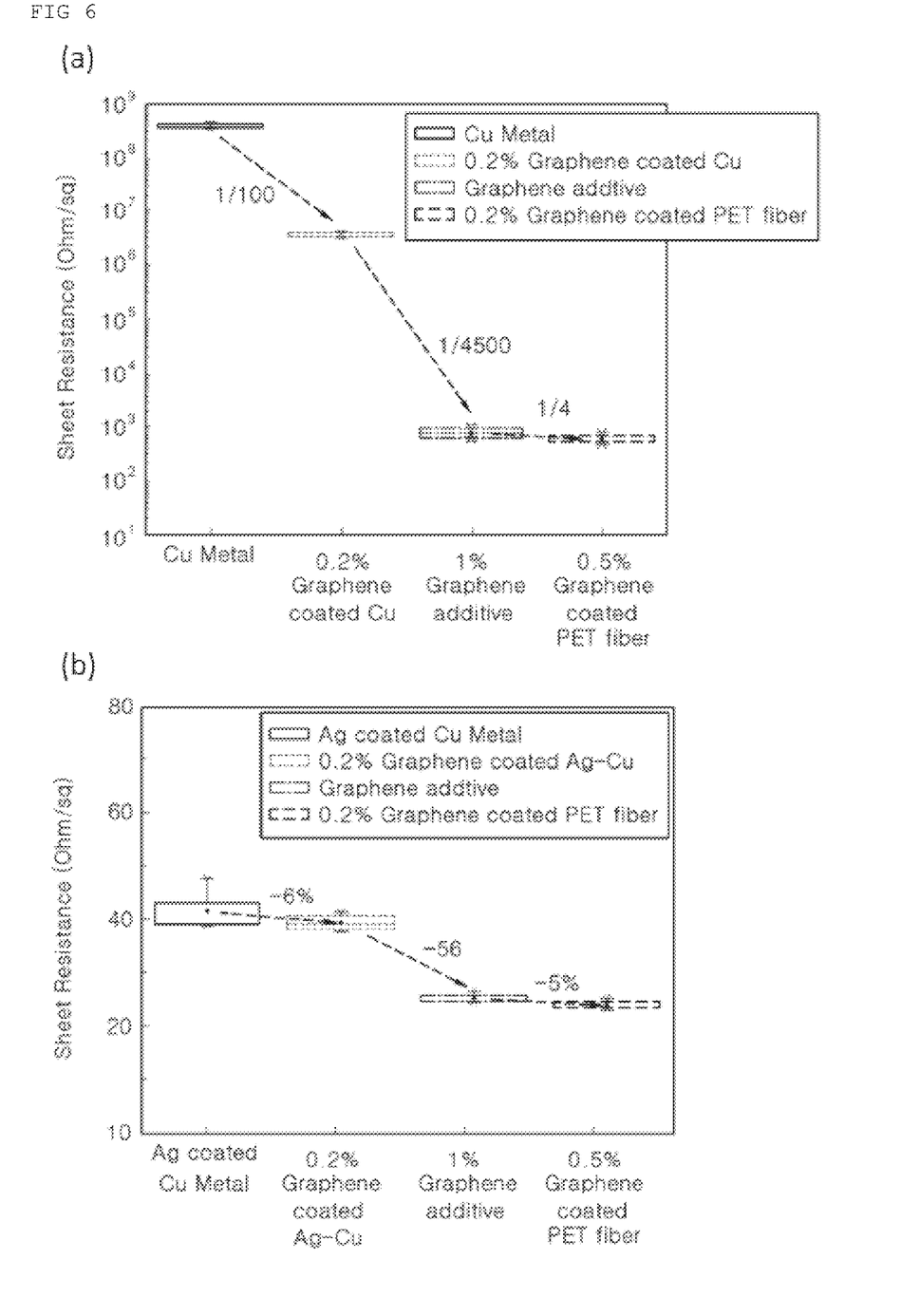
FIG. 6 is a graph for explaining a measurement of the sheet resistance of the conductive film manufactured of the conductive paste composition to examine an effect of changing a type of each configuration of the conductive paste composition.

FIG. 6 illustrates the measurement of the sheet resistance of the conductive film manufactured of the conductive paste composition to examine the effect of changing the type of each component of the conductive paste composition.

Referring to FIG. 6(a), as compared with a case in which copper particles as the conductive metal particles are simply used, in a case in which the copper particles coated with the second graphene are used, the sheet resistance is decreased to $1/100$ and in addition thereto, in a case in which the graphene additive is 1 wt %, the sheet resistance is decreased to $1/4500$. In addition, it can be seen that in a case in which the PET fiber coated with the first graphene is added, the sheet resistance is decreased to $1/4$.

Referring to FIG. 6(b), as compared with a case in which the copper particles coated with silver (Ag) as the conductive metal particles is used, in a case in which the copper particles coated with the second graphene is used, the sheet resistance is decreased by substantially 6%, in addition, in a case in which the graphene additive is 1 wt %, the sheet resistance is decreased by substantially 56%. Furthermore, in a case in which the PET fiber coated with the first graphene is added, the sheet resistance is additionally decreased by substantially 5%.

When FIGS. 6(a) and 6(b) are compared, it can be seen that as compared with a case in which the copper particles coated with silver (Ag) as the conductive metal particles, in a case in which the copper particles are simply used as the conductive metal particles, the effect of using the graphene is remarkable. This is due to the fact that the copper particles have low oxidation stability of themselves, and that the added graphene serves to prevent oxidation. In particular, copper is inexpensive compared to silver, and high performance can be expected even at a low price by applying the graphene as in the present invention.

Figure 7:
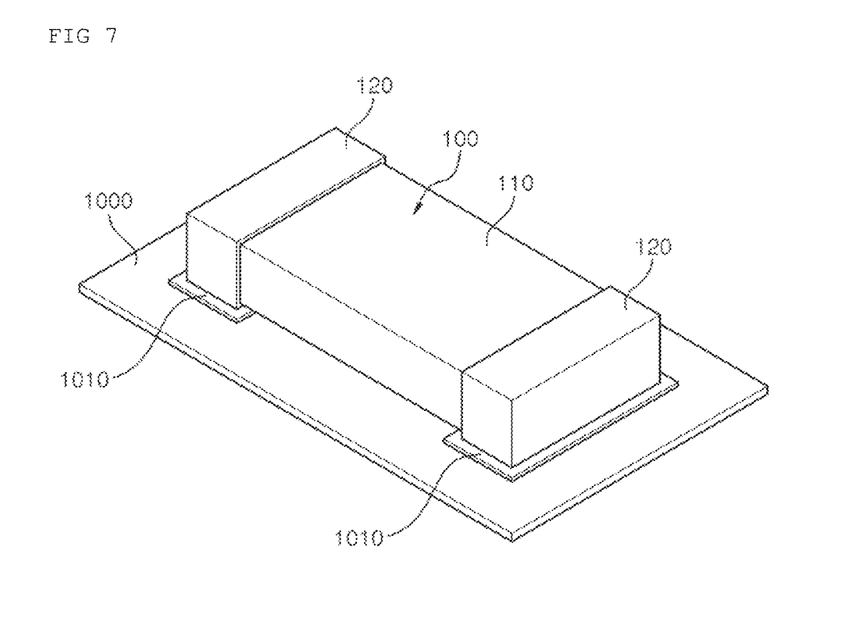
FIG. 7 is a schematic perspective view illustrating an electronic component according to another example of the present disclosure, and illustrating that the electronic component is mounted on a printed circuit board.

FIG. 7 is a schematic perspective view of an electronic component according to another example of the present disclosure, and illustrates that the electronic component is mounted on a printed circuit board.

Referring to FIG. 7, an electronic component 100 according to another example of the present invention includes a ceramic body 110 and an external electrode 120 disposed outside the ceramic body 110. In this case, the external electrode 120 is formed of the conductive paste composition according to an example of the present invention. The ceramic body 110 is formed by sintering ceramic particles, and forms an internal electrode on an inner side thereof to be an electronic component.

On the other hand, in order to examine the effect of the conductive paste composition according to an example of the present invention on the flexural strength evaluation of a printed circuit board 1000 on which the electronic component 100 is mounted, the electronic component 100 is mounted such that the external electrode 120 is positioned in an electrode pad 1010 of the printed circuit board 1000.

Figure 8:
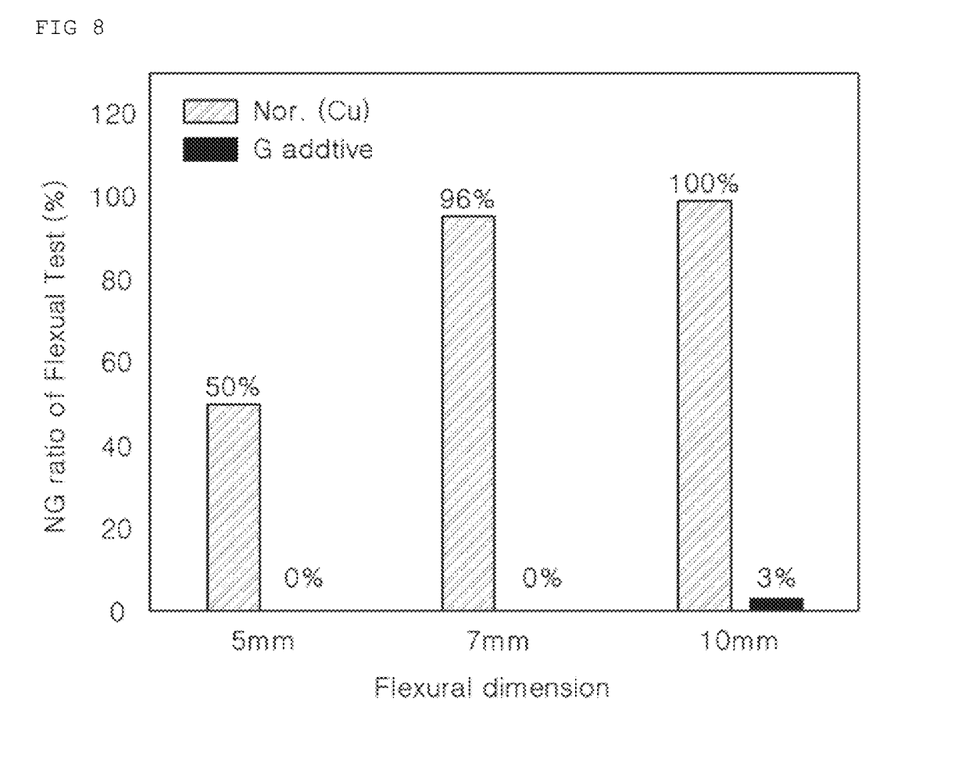
FIG. 8 is a graph illustrating a result of performing a flexural strength evaluation after an electronic component having a 2012 size is mounted on the printed circuit board.

FIG. 8 illustrates a result of performing the flexural strength evaluation after an electronic component having a 2012 size is mounted on the printed circuit board. Here, the electronic component means a capacitor, an inductor, a piezoelectric element, a varistor, a thermistor, or the like.

The conductive paste composition, which is used in FIG. 8, used the following composition.

As the polymer fiber, the PET fiber (average thickness: 2 μm, average length: 10 μm, and evaluated by applying a small fiber in accordance with a size of the external electrode when the electronic component is applied) was used, and the PET fiber, which was coated with the first graphene including 0.5 wt % based on the weight of the polymer fiber, was used. As the conductive metal particles, the second graphene coated copper particles were used, and the content of the second graphene was 0.2% based on the weight of the copper particles. The content of the graphene additive is 1 wt % based on the total composition.

In the related art, in a case in which only copper is simply used as the conductive metal particles, when the flexural strength was evaluated, cracks occurred in 50% of the main body at 5 mm and thereby defectiveness (NG) was determined, and cracks occurred in 100% of the main body at 10 mm and thereby defectiveness was determined.

However, it can be seen that in a case of the conductive paste composition according to an example of the present invention, there is no defect determination up to 7 mm, and only 3% of the conductive paste composition has been determined as defective.

In conclusion, by using the conductive paste composition according to an example of the present invention, it is expected that the mounting reliability of the electronic component can be significantly improved.

The scope of protection of the present invention is not limited to the description and the expression of the examples explicitly described above. In addition, it is once again added that the scope of protection of the present invention must not be limited due to obvious changes or substitutions in the technical field to which the present invention pertains.

What is claimed is:

1. A conductive paste composition comprising:
   conductive metal particles, wherein a content of the conductive metal particles is 65 to 92 wt % based on the total composition;
   a polymer fiber, wherein the polymer fiber is coated with a first graphene on a surface thereof, wherein a content of the polymer fiber coated with the first graphene is 0.1 to 1 wt % based on the total composition;
   a polymer resin, wherein a content of the polymer resin is 7 to 22 wt % based on the total composition;
   an auxiliary additive; and
   a graphene additive, wherein the graphene additive is any one or a combination thereof selected from a group consisting of graphene flake, reduced graphene, graphene oxide, and modified graphene, wherein a content of the graphene additive is 0.1 to 5 wt % based on the total composition.

2. The conductive paste composition according to claim 1, wherein the polymer fiber has a thickness of 1 to 10 µm and a length of 0.01 to 10 mm.

3. The conductive paste composition according to claim 1, wherein the first graphene coated on the polymer fiber has a thickness of 0.2 to 10 nm.

4. The conductive paste composition according to claim 1, wherein the polymer fiber is any one or a combination thereof selected from a group consisting of polyethylene terephthalate (PET) fiber, polyethylene (PE) fiber, polyurethanes (PU) fiber, polyamide (PA) fiber, polycarbonate (PC) fiber, polyoxymethylene (POM) fiber, polybutyrene terephthalate (PBT) fiber, acrylonitrile butadiene styrene (ABS) fiber, and polypropylene (PP) fiber.

5. The conductive paste composition according to claim 1, wherein the conductive metal particles are coated with a second graphene on a surface thereof.

6. A ceramic electronic component comprising:
   a ceramic body; and an external electrode disposed outside the ceramic body,
   wherein the external electrode is formed by curing the conductive paste composition according to claim 1.

* * * * *